United States Patent [19]
Lurie et al.

[11] Patent Number: 6,150,817
[45] Date of Patent: Nov. 21, 2000

[54] MAGNETIC RESONANCE APPARATUS HAVING REDUCED "DEAD TIME"

[75] Inventors: David John Lurie, Aberdeen; Marcello Alecci, Headington; John Anthony Brivati, Canterbury, all of United Kingdom; Luca Testa, L'Aquila, Italy; Guiseppe Placidi, Sassa, Italy; Antonello Sotgiu, Assergi, Italy

[73] Assignee: BTG International Limited, London, United Kingdom

[21] Appl. No.: 09/298,171

[22] Filed: Apr. 23, 1999

Related U.S. Application Data

[63] Continuation of application No. PCT/GB97/02936, Oct. 24, 1997.

[30] Foreign Application Priority Data

Oct. 25, 1996 [GB] United Kingdom .................... 9622183

[51] Int. Cl.[7] ........................................................ G01V 3/00
[52] U.S. Cl. .......................... 324/318; 328/319; 328/309
[58] Field of Search .................................. 324/314, 309, 324/307, 308, 322, 318, 319

[56] References Cited

U.S. PATENT DOCUMENTS

| | | | |
|---|---|---|---|
| 3,768,003 | 10/1973 | Amen et al. | 324/314 |
| 5,068,611 | 11/1991 | Savelainen et al. | 324/314 |

FOREIGN PATENT DOCUMENTS

97/07412   2/1997   WIPO.

OTHER PUBLICATIONS

J Bourg et al., *J Magn Reson. B*, 102, 112 (1993).
J A Pople, W.G. Scheider, and II J Bernstein, "High–Resolution NMR", McGraw–Hill, New York (1959).
G A Rinard, et al., Proc 19th Int. F.P.R. Symposium, 38th Rochy Mountain Conference on Analytical Chemistry, Abstract #147, Denver, USA, Jul. 21–26 (1996).
C N Chen and D I Hoult "Biomedical Magnetic Resonance Technology", IOP Publishing, Bristol, UK (1989).
P Mansfield and P G Morris, "NMR Imaging in Biomedicine", in Advances in Magnetic Resonance, suppl. 2 (cd. J.S. Waugh), Academic Press, New York (1982).

*Primary Examiner*—Christine Oda
*Assistant Examiner*—Brij B. Shrivastav
*Attorney, Agent, or Firm*—Nixon & Vanderhye

[57] ABSTRACT

The invention concerns an improved magnetic resonance apparatus and method for substantially reducing the dead time of the apparatus, in order to recover as much of the submicrosecond FID signals as quickly as possible. A double-channel, out-of-phase signal combination is employed. Two RF receiving coils are arranged with identical ringing characteristics, preferably mutually perpendicular to one another. The RF signal received by one coil is phase shifted by 180°, amplified, and combined with the amplified RF signal received by the other coil. The ringing components cancel, while the FID components in phase quadrature do not. The transmitter/receiver apparatus may be of duplex or crossed coil configuration. In the latter case, one of the receiver coils may be orientated parallel to the main field so that it receives no FID signal and operates only to reduce the dead time. The invention is particularly well suited for imagers and spectrometers using pulsed electron paramagnetic resonance (EPR), for the detection of free radicals in biological systems, or for pulsed nuclear magnetic resonance (NMR), where relaxation times are of the order of 100 ns to 10 μs.

21 Claims, 8 Drawing Sheets

DUPLEX

CROSSED COILS

MAGNETIC RESONANCE APPARATUS HAVING REDUCED "DEAD TIME"

This is a continuation of PCT application No. PCT/GB97/02936, filed Oct. 24, 1997.

The present invention relates to an improved magnetic resonance apparatus in which the dead time of the apparatus is substantially reduced, or preferably removed. The invention is particularly suitable for use with magnetic resonance imagers and spectrometers.

The invention may be used in applications where the relaxation times $T_1$ and/or $T_2$ are in the sub-microsecond range. The invention is particularly well suited for use with pulsed Electron Paramagnetic Resonance (EPR) at radio frequency in the region of 220 MHz for the detection of free radicals in biological systems. However, it will be appreciated that the applicability is very broad and, for example, the invention may be used for pulsed NMR imaging of solids where the relaxation times may be less than 10 $\mu$s.

BACKGROUND OF THE INVENTION

Continuous wave (CW) radio frequency (rf) (100–300 MHz) EPR has been developed in many laboratories, for example for the detection and imaging of free radicals in small rats. Currently this technique presents some limitations under in vivo conditions, such as limited sensitivity (5–50 $\mu$M) and slow acquisition rate typically 5 minutes, to obtain a two-dimensional (2-D) image.

The use of pulsed EPR techniques overcomes current limitations. However, in contrast to NMR, the development of pulsed EPR has been very slow. The main reason is that the electron spin relaxation times ($T_1$ and $T_2$) are orders of magnitude shorter (100 ns to 10 $\mu$s) than the typical nuclear relaxation times (10 ms to 1 s). These shorter relaxation times place extreme demands on experimental and technical conditions such as pulse duration, pulse power, instrumental dead time, and digital electronics hardware. Only in the last decade or so have pulsed EPR instruments, operating at X-band (9 GHz), been proposed and only very recently become commercially available.

A pulsed EPR spectrometer specifically developed for imaging applications and operating at 300 MHz was proposed by Bourg et al., in J. Magnetic Resonance B, 102, 112 (1993). In the design of this instrument the classical NMR-type duplex configuration—a small coil transmitter/receiver with passive receiver protection—was employed. A very small solenoid coil (four-turn coil, 8 mm in diameter) was used. This ensured a very high efficiency factor, $\beta$, of the coil defined as: $\beta = (B_1/\sqrt{P})$, where $B_1$ is the amplitude of the rf magnetic field and P is the power incident on the coil. The device allowed operation with a very small sample ($\approx$2 ml) and at low rf power levels and, consequently, a short instrumental dead time ($T_D$) was obtained.

Unfortunately, the design followed by Bourg et al., is not suitable when large samples (10 to 100 ml) are used. In fact, the efficiency factor of the resonator decreases with the sample volume, requiring the use of high rf power. Because the dead time increases with the rf power, it can become very difficult, if not impossible, to detect the free induction decay (FID) signal of a paramagnetic species with short relaxation times. This represents a strong instrumental limitation for the development of pulsed rf EPR and reduces the potential biological applications of the technique. A similar problem has been experienced in solid nuclear magnetic resonance apparatus.

A number of problems are suffered by Magnetic Resonance Imagers and Spectrometers which degrade images and signals. In order to obtain adequate signals and good signal-to-noise ratio (SNR), it is necessary to have fast rf pulse application, a high rf power input capability and efficient resonators. In addition to this it is highly desirable to have fast data acquisition and electronic processing capability as well as a short instrumental dead time. The dead time of an instrument limits its ability to detect any events until it recovers. Accordingly when an instrument is in its dead time it is unable to detect anything of use.

The primary source of instrumental dead time is the ringing of the cavity or resonator, and the dead time of a magnetic resonance instrument ($T_D$) can be expressed as:

$$T_D = \tau_D \cdot \ln(P^*_{TX}/P_{NOISE})$$

where $P^*_{TX}$ is the transmitted power leaking to the receiver and $P_{NOISE}$ is the detector noise. $\tau_D$ is the resonator ringing time and is itself expressed as:

$$\tau_D = 1/\pi \Delta v$$

where $\Delta v$ is the bandwidth of the resonator.

There are a number of ways in which dead-time can be reduced. For example, the bandwidth ($\Delta v$) of the resonator can be increased by reducing the quality factor (Q). However, this has the effect of reducing sensitivity and, because more transmitter power is required, more power can leak to the receiver. Overcoupling of the resonator tends to reduce the dead-time, but gives rise to harmonics and interference due to reflected waves. Such interference can damage amplifiers and there is a risk that more power will leak into the receiver coil. It is known that the ringing time of a resonator may be reduced by reversing the RF pulse (i.e. phase shifting it by 180°) for a short time period at the end of the main pulse. This 'quenching' pulse results in the microwave magnetic field $B_1$ in the cavity tending not to zero but to a negative value in the rotating frame with the same time constant. During this process $B_1$ crosses the zero value. If tie quenching pulse is switched off right at the moment of zero crossing there is no more energy left in the cavity to radiate. This technique therefore results in at least partial cancellation of the ringing of the resonator, but its effects are limited.

Alternatively, electronic equipment may be enhanced to reduce the dead-time, but this merely addresses the symptoms of prolonged dead-time, not the cause. Consequently there will always be a limit imposed on the technique.

SUMMARY OF THE INVENTION

The present invention arose in an attempt to solve the problem of dead-time in magnetic resonance apparatus at its source, rather than try to solve the symptoms.

According to the present invention there is provided a method of magnetic resonance investigation of an object comprising the steps of:

applying a static magnetic field to the object;

applying an RF excitation pulse to the object;

detecting, after the RF excitation pulse has ceased, a first RF signal by means of a first RF receiver resonator and a second RF signal by means of a second RF receiver resonator; and providing a difference signal representing the difference between said first RF signal and said second RF signal.

Preferably the first RF signal is inverted and then combined with the second RF signal to provide said difference signal. The relative phase and/or the relative amplitude between the first and second RF signals may be adjusted.

The subtraction of one signal from the other greatly reduces the time necessary for the transmitted rf pulse energy to reach the noise level or a predetermined fixed level. This makes it possible to switch on one channel only or two channels simultaneously and thereby selectively detect the FID signal much earlier than before. The effect is that the dead time is reduced or preferably removed. Consequently the invention may be used with EPR or solid NMR where relaxation times ($T_1$, $T_2$) are of the order of 100 nanoseconds (ns) to 10 microseconds ($\mu s$).

The application of said RF excitation pulse may be followed by the application of a phase-reversed RF pulse. This second RF pulse has the beneficial effect of further reducing the dead time.

In one embodiment of the invention, at least one of said first and second RF receiver resonators is used to apply said RF excitation pulse.

According to a further aspect of the invention, a method of magnetic resonance investigation of an object is provided, comprising the steps of:

applying a static magnetic field to the object;

applying an RF excitation pulse to the object;

detecting, via a first and a second RF receiver resonator arranged to detect fields in mutually non-parallel directions, RF signals comprising a directional and a non-directional component; and combining the RF signal detected by said first RF receiver resonator with that detected by said second resonator in such a way as to provide a signal free of said non-directional component.

According to a yet further aspect of the invention, there is provided pulsed magnetic resonance apparatus comprising:

means for applying a static magnetic field;

an RF transmitter resonator;

first and second RF receiver resonators; and means to provide a signal representing the difference between the signals received by said first and said second RF receiver resonators.

The RF transmitter resonator may conveniently be provided by a loop-gap resonator.

In a preferred form, each of the first and second RF receiver resonators is connected to a separate receiver channel, and a signal attenuator and/or a phase shifter is provided in at least one of the receiver channels to vary the relative amplitude and/or phase between the signals received by the two receiver resonators. The combined effect of the phase and amplitude variation means enables balancing of the characteristics of the two coils so that they are as similar as possible.

Preferably, the first and the second RF receiver resonators are arranged to detect fields in mutually non-parallel directions. Most conveniently they are arranged mutually perpendicular to receive in phase quadrature with each other.

In one convenient arrangement, the first RF receiver resonator is arranged parallel to the main static magnetic field.

The first and second RF receiver resonators may be provided by two modes of a birdcage resonator.

In one form of the invention, at least one of said first and second RF receiver resonators is arranged and connected also to serve as the RF transmitter coil, the apparatus including switching means to switch the at least one resonator between a transmit mode and a receive mode.

In an alternative form of the invention, separate resonators are used for said RF transmitter resonator and said first and second RF receiver resonators, all three resonators being mutually perpendicular.

The apparatus is preferably tuned to a frequency of the order of a few hundred MHz and is capable of accommodating samples of sizes of typically in the range of 10 ml to several hundred ml. Further details of the transmit and receive coils (TX/RX) are given below as well as experimental results showing the use of the TX/RX with CW and pulsed EPR spectroscopy.

BRIEF DESCRIPTION OF THE DRAWING

Preferred embodiments of the invention will now be described, by way of example only, with reference to the accompanying drawings in which.

DETAILED DESCRIPTION OF PREFERRED EMBODIMENTS

Figure 1A:
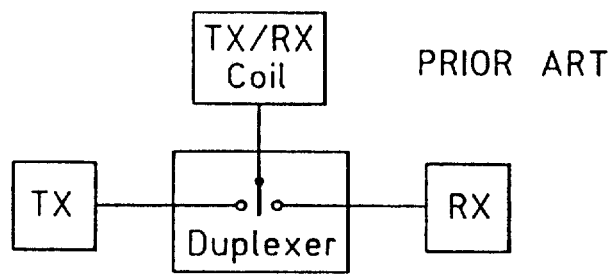
FIG. 1 is a diagrammatical view of two embodiments of the invention in (b) a duplex configuration, (d) a cross coupled coil configuration and also showing corresponding prior art versions of each configuration (respectively (a) and (c)
Figure 1B:
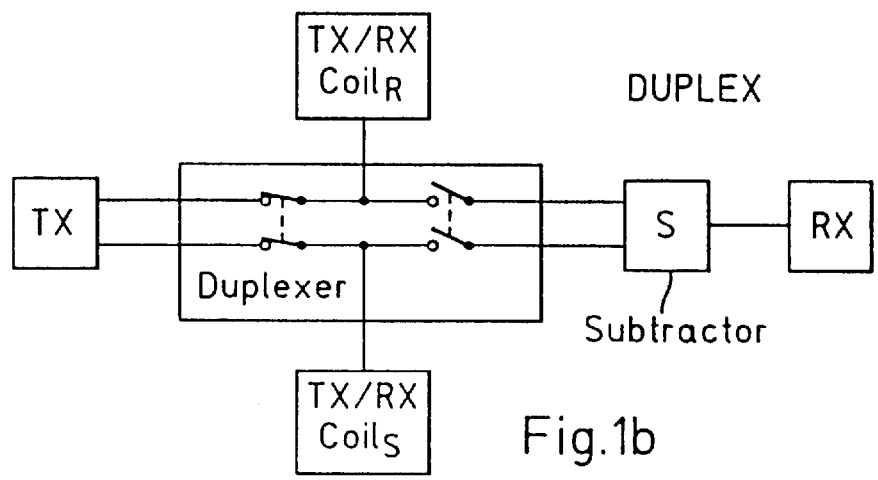
Figure 1C:
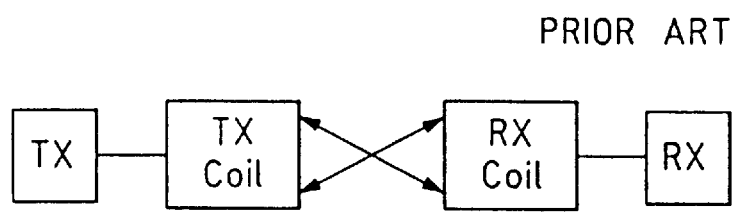
Figure 1D:
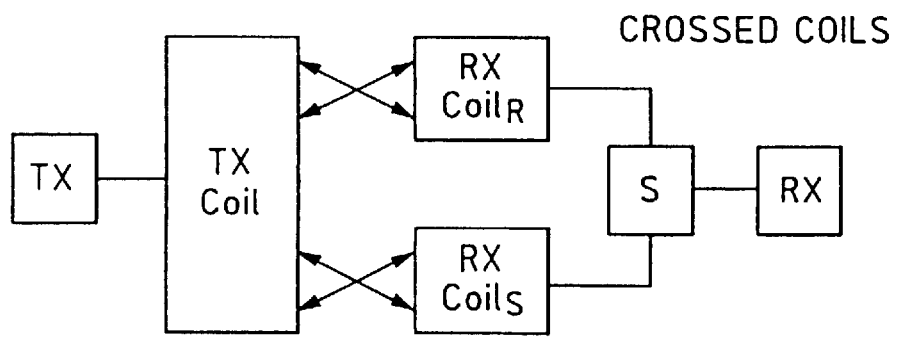
Figure 2:
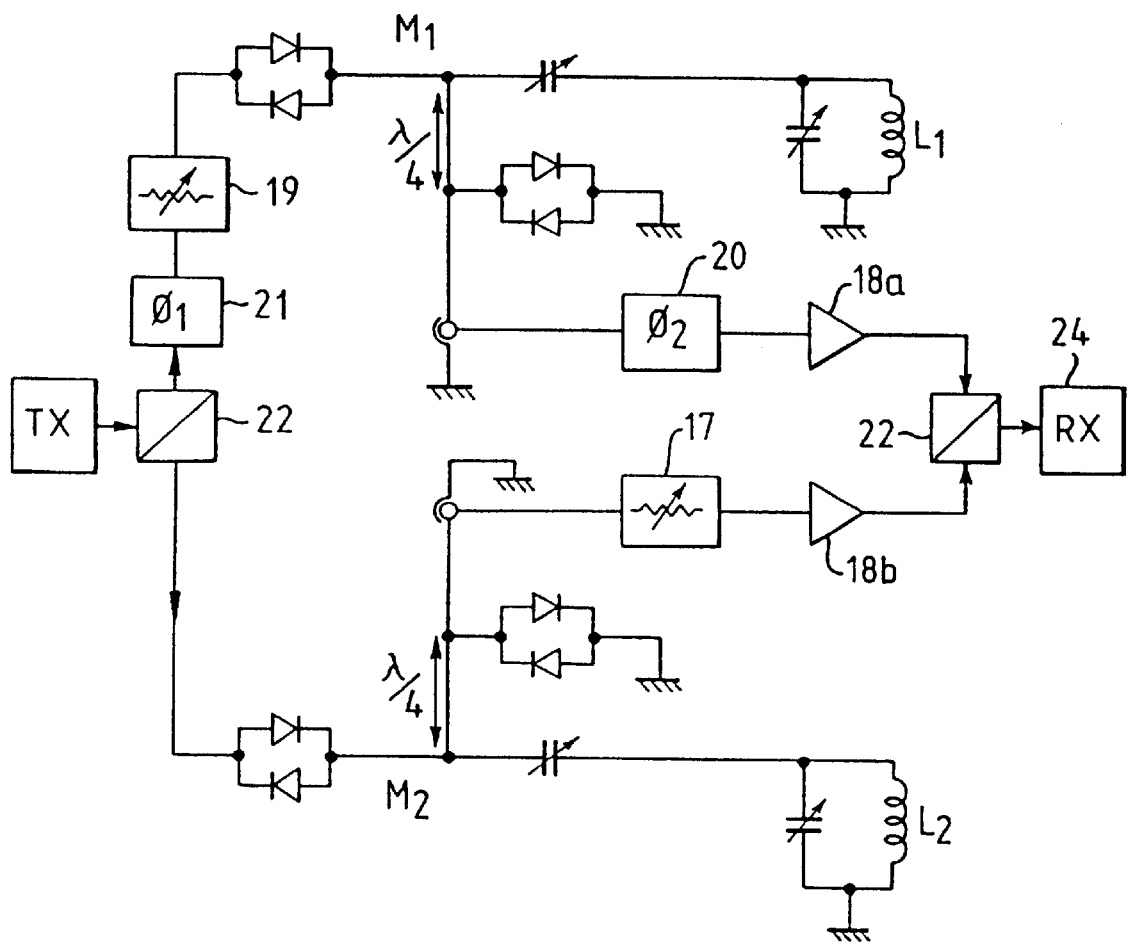
FIG. 2 is a circuit diagram of the embodiment of the invention (duplex configuration) corresponding to that shown in FIG. 1(b)

In FIG. 2 a duplex configuration of the transmitter/receiver of the invention is illustrated. The two coils $L_1$ and $L_2$ are mutually perpendicular and are used both to transmit and receive RF signals, with a conventional passive transmit/receive switching arrangement—to isolate the transmitter from the receiver at any given time—as shown $\emptyset_1$ phase shifter 21 is used as a 90° shifter to provide that the two coils transmit in phase, and attenuator 19 is used to balance the transmitted signals. In the receiver circuit, $\emptyset_2$ phase shifter 20 is a 180° shifter to invert the signal received from $L_1$, whilst attenuator 17 is used to balance the amplitudes of the received ringing signals. 18a and 18b are low-noise preamplifiers, whilst a power combiner 22 sends the combined signal to receiver 24 from where it can be processed to provide an image. It is, of course, also possible to apply the RF signal through only one coil ($L_1$, or $L_2$), and then switch to receive via both coils.

To improve the isolation between the transmitter and the receiver a crossed coupled coil configuration is preferred (see FIG. 3), in which a third RF coil is provided as a transmitter, and the two coils $L_1$ and $L_2$ are used as receiver coils only. High isolation is achieved by arranging the receiving coils perpendicular to the RF transmitter resonator.

Figure 3:
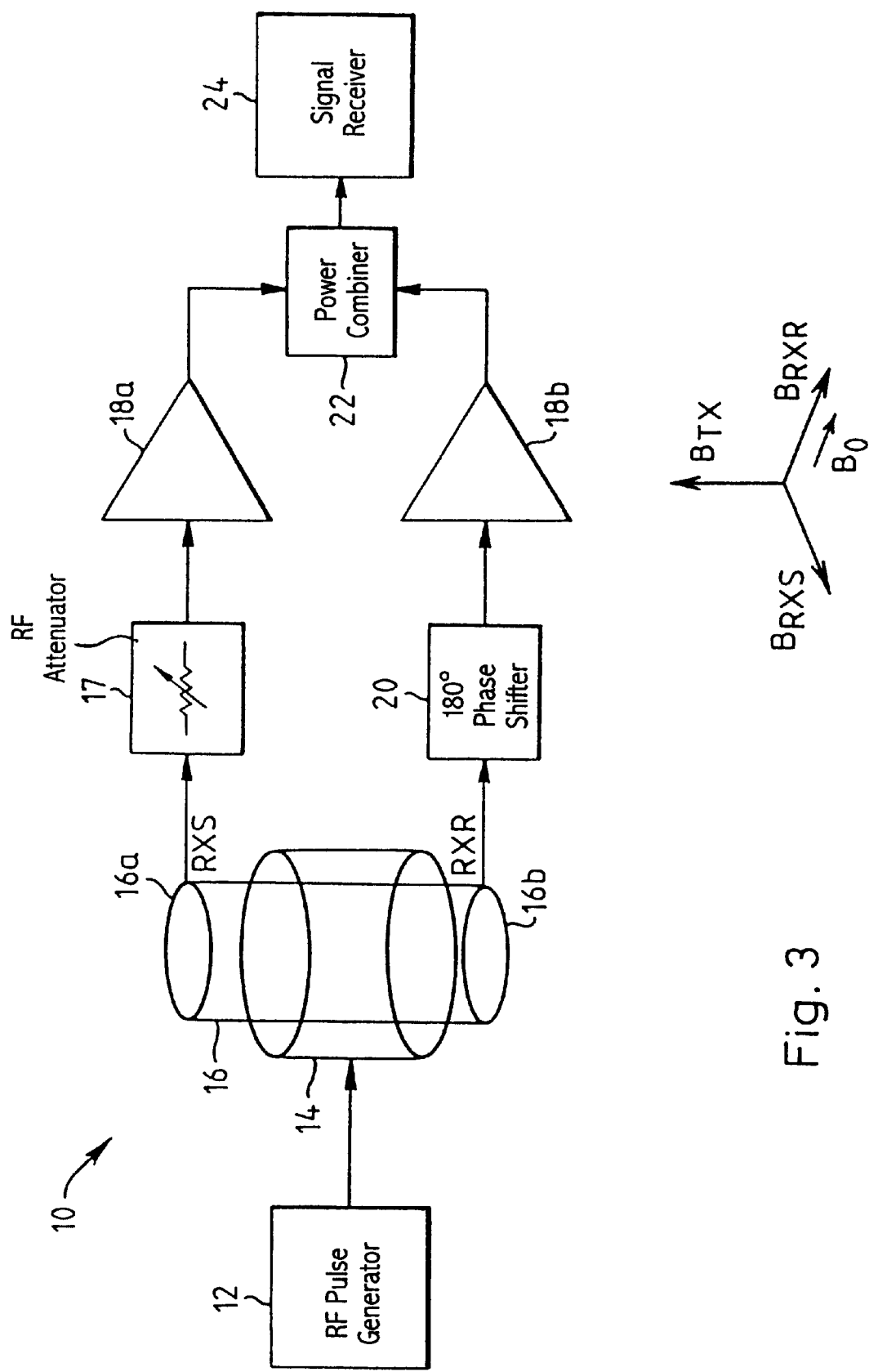
FIG. 3 is a schematic diagram of the embodiment of the invention (crossed coupled coil configuration) shown in FIG. 1(d)

Referring to FIG. 3 a magnetic resonance apparatus 10 of the TX/RX type is shown. A crossed coil configuration with a separate transmitter (TX) resonator and a receiver (RX) resonator has an rf pulse generator 12, a TX resonator coil 14, a double-channel RX resonator coil 16 and a variable rf attenuator 17. Also shown are low-noise preamplifiers 18a and 18b and a 180° phase shifter 20. A power combiner 22 combines signals from the two amplifiers 18 and sends the combined signal to receiver 24 from where it is processed. The two separate coils 14 and 16 (TX and RX) are geometrically perpendicular to one another and are tuned to the same frequency. This provides a high isolation (30–40 dB) between TX and RX, with a consequent reduction of $T_D$. A similar design was proposed in the early years of NMR spectroscopy by J. A. Pople, W. G. and H. J. Bernstein in 'High Resolution NMR', McGraw Hill (1959), and more recently in CW NMR imaging of solids by D. J. Lurie et al. in International Patent Application WO-A-97/07412 and in EPR, G. A. Rinard et al., Proceedings 19th Inst. EPR Symposium, Abstract No. 147, Denver, U.S.A., Jul. 21–26 (1996).

The RX coil comprises two identical coils 16a and 16b which are geometrically perpendicular to each other and both their $B_1$ fields are perpendicular to the TX field. In principle, the two receiving coils have identical rf parameters, i.e. resonant frequency ($f_0$), quality factor (Q), bandwidth ($\Delta v$), ringing time ($\tau_D$). One of the two receiving coils 16a is perpendicular to the main field and is used as a receiver (RXS) for the FID signal of the paramagnetic (or nuclear) probes; the other receiving coil 16b (RXR) is parallel to the main field and is used to reduce the ringing time of the instrument.

The ringing voltages generated by the two coils 16a and 16b (RXS and RXR) are assumed to be identical, since they are excited in the same way by the same power pulse from the TX coil 14. This assumption is reasonable since isolation between the two coils 16a and 16b is typically 20 to 40 dB. As shown for example in FIG. 3, the output of RXS is amplified and connected to one input of a power combiner, giving rise to the FID; while the output of RXR is shifted in phase by 180°, amplified and finally connected to the other input of the power combiner. At the output of power combiner 22 there is a very marked reduction of the dead time ($T_D$) as a result of the out-of-phase cancellation of the ringing-down voltage of the two RX coils 16a and 16b. However, the FID's generated by RXS and RXR are in quadrature, because the two receiving coils 16a and 16b are geometrically perpendicular, and the combination will not cancel. For ease of operation, in the embodiment illustrated, RXR coil 16b is oriented parallel to the main magnetic field $B_0$ and it will therefore not detect any FID, but the system will work for any orientation of the TX/RX coils with respect to the main field.

As an example, a prototype TX/RX assembly is described with some preliminary experiments obtained with CW and pulsed EPR at 220 MHz with specific reference to FIGS. 3 to 9.

Design of the TX Section

The TX section, schematically shown in FIG. 3, has an rf source 12 (Hewlett Packard model HP8640B, not shown) which generates the 220 MHz signal connected to the TX pulse switch (Mini-Circuit, ZYSWA-2-50DA not shown). The circuit is controlled by the main pulse generator (Tabor (TRADE MARK) electronics, model 8600 not shown). The rf pulse (minimum width 15 ns) is amplified 40 dB by a high power amplifier (Mini-Circuit, ZHL-5W-1, not shown) giving 4 W rms output. This power is connected to an NMR-type crossed diodes (Philips, BAW62 not shown) circuit with ë/4 line tuned to 220 MHz, that provides a threshold barrier to remove the noise of the TX (minimum 60 dB) and the falling edge of the transmitter pulse. Such a circuit is described in detail in P. Mansfield and P. G. Morris, 'NMR Imaging in Biomedicine', Suppl. 2, Advances in Magnetic Resonance, Academic Press 1982, at page 281. The pulsed power is connected, via a phase shifter (not shown) to a loop-gap TX resonator. The function of the phase shifter is to optimise the tuning/matching of the TX resonator to the source.

Figure 4:
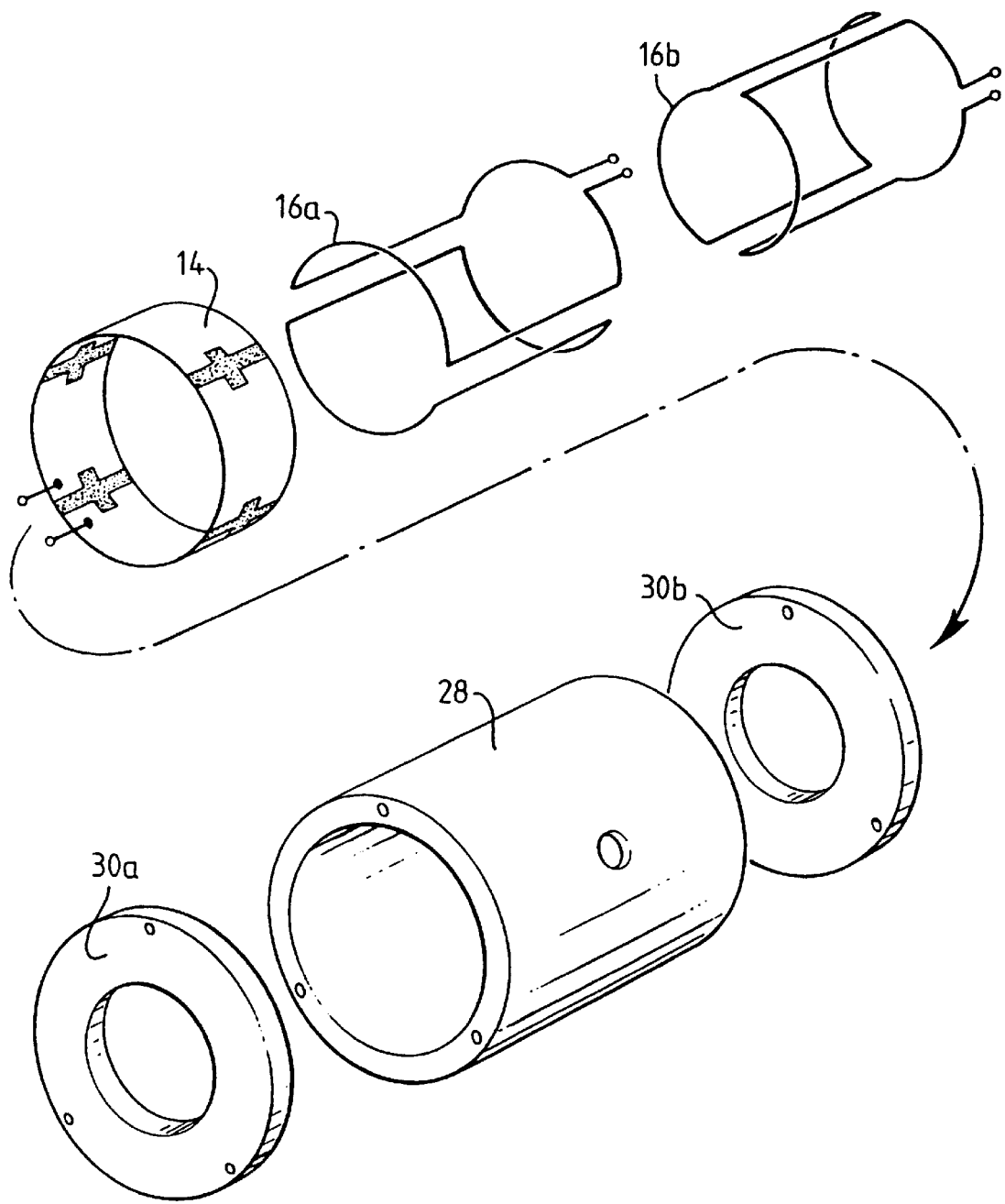
FIG. 4 is a schematic view of a crossed coil arrangement showing diagrammatically a TX loop-gap resonator, saddle shaped RXS and RXR resonators, an rf shield and a mechanical support structure.
Figure 5:
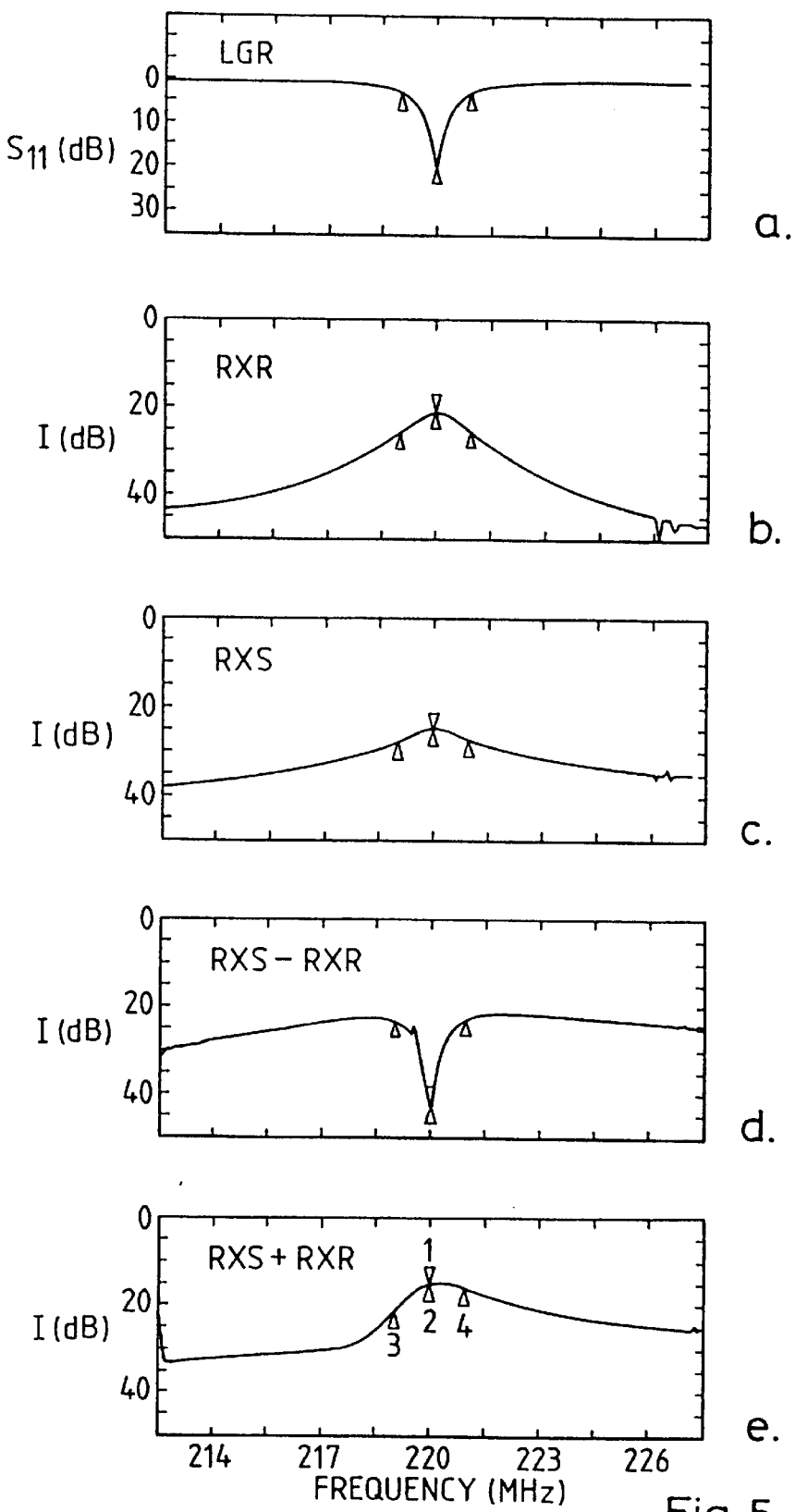
FIG. 5 show graphs of measured: (a) reflection coefficient ($S_{11}$) of the TX loop gap resonator, (b) isolation (I) of the RXR resonator only, (c) isolation of the RXS resonator only, (d) out-of-phase combination of RXS and RXR resonators; and (e) in-phase combination of RXS and RXR resonators.

The TX resonator 14, see FIG. 4, is a one-loop, four-gap resonator, for example of the type described by W. Froncisz and J. S. Hyde in J. Mag. Res.. Vol. 47 (1982) at page 515, with diameter 59 mm and length 20 mm. The resonator is contained in a brass shield 28, FIG. 4, with internal diameter 75 mm and length 90 mm. The inductive elements of the particular resonator are obtained from four strips (20×44× 0.076 mm) of adhesive copper (RS components, UK). Four identical high quality factor (Q) chip-capacitors (Murata Inc., U.S.A.) of 36 pF are used to tune the resonator to 220 MHz. The use of one capacitive trimmer 5530 pF (Q>500) allows tuning of the resonator over a range of 14 MHz. The resonator has an unloaded quality factor ($Q_{TX}$) of 170 when empty, whereas $Q_{TX}$ is 100 with 55 ml of physiological saline solution sample. The TX resonator is coupled to the rf source by a standard $\lambda/4$ triaxial balun and a balanced capacitive network (C. N. Chen and D. I. Hoult 'Biomedical Magnetic Resonance Technology', IOP Publishing, UK 1989).

Design of the RX Section

The receiving resonator is composed of two identical pairs of saddle coils 16a and 16b, as shown in FIG. 4. The two sections of the resonator (RXS and RXR) are perpendicular and they serve to reduce the dead time of RX, as illustrated below. A TEFLON (Registered Trade Mark) tube (not shown) 36 mm in diameter is used for the construction of the RXS and RXR sections of the resonator. Each saddle is made by adhesive copper strip (RS components, UK) 4 mm wide. The angular aperture of the saddle is 82° and the length is 50 mm. The two parts of each saddle pair are connected in parallel by 35 mm of RG176 cable. At the end of the cable a capacitive high Q trimmer (357 pF) allows fine tuning of the resonator to 220 MHz. As for the TX resonator, a standard $\lambda/4$ triaxial balun and a balanced capacitive network is used to couple each of the two receiving coils. The unloaded quality factor ($Q_{RX}$) of the empty receiving resonators is 105, and after the insertion of 55 ml of physiological solution $Q_{RX}$ of 35. The output of RXS is amplified by a low-noise preamplifier (Mini Circuit, MAN-1-HLN) and connected to one input of a power combiner (Mini Circuit, ZFSCJ-2-1). The output of RXR is connected to a 180° phase-shifter before pre-amplification and connection to the other input of the power combiner. A continuously variable rf attenuator is inserted after the RXS coil to reduce the imbalance between the two receiving channels.

For the prototype assembly, a network analyser (HP8753A) was used to measure the isolation between the TX/RX coils with 55 ml of physiological solution inserted in the resonator. The TX loop-gap resonator (LGR) was used as transmitter (FIG. 5a) and isolation was measured with the RXR receiver only (FIG. 5b). Alternatively the RXS coil may be used as shown in FIG. 5c or an out-of-phase combination of RXS and RXR may be used, as shown in FIG. 5d. In these conditions a marked increase of the isolation (40–50 dB) at the resonant frequency, within a bandwidth of a few MHz, was observed. For comparison FIG. 5e shows the isolation measured with the in-phase combination of RXS and RXR.

Figure 6:
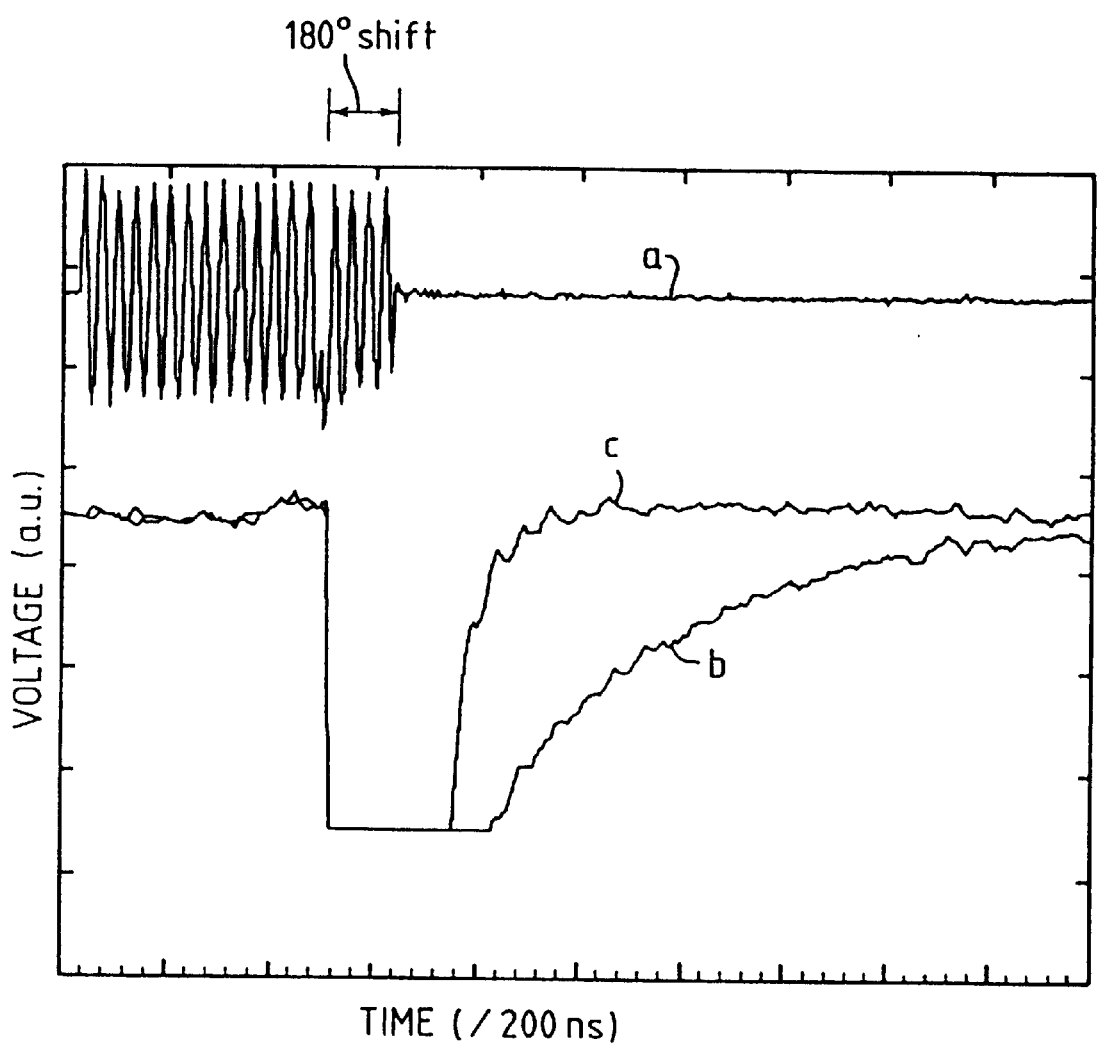
FIG. 6 is a graph showing measured (a) the TX rf pulse (b) the decay of rf pulse with single channel detection using RXS only (or RXR only) and (c) the decay of rf pulse with double channel out-of-phase compensation according to the invention.

The output of power combiner 22 was connected to a rf switch (Mini-Circuit, ZYSWA-2-50DA), amplified (70 dB) and detected by a balanced mixer (Mini-Circuit, ZAD-1) whose local oscillator input was obtained from the rf source via a power splitter (Mini-Circuit, ZFSC-2-2). The output of the mixer was observed with a digital oscilloscope (Tektronix, TDS 540). Under these conditions, the decay of the rf pulse in the TX/RX assembly was measured. A high power (4 W rms) rf pulse of 400 ns in length was applied to the TX resonator (FIG. 6). The pulse shown employed phase reversal (180° shift) in order to further reduce the dead time. The ringing down was observed with single channel detection using RXS only (trace b of FIG. 6) and with double-channel out-of-phase combination using RXS and RXR (trace c). As the experimental results show, a significant reduction in the dead time with double-channel detection is obtained.

Continuous Wave (CW) EPR Detection at 220 MHz

Figure 7:
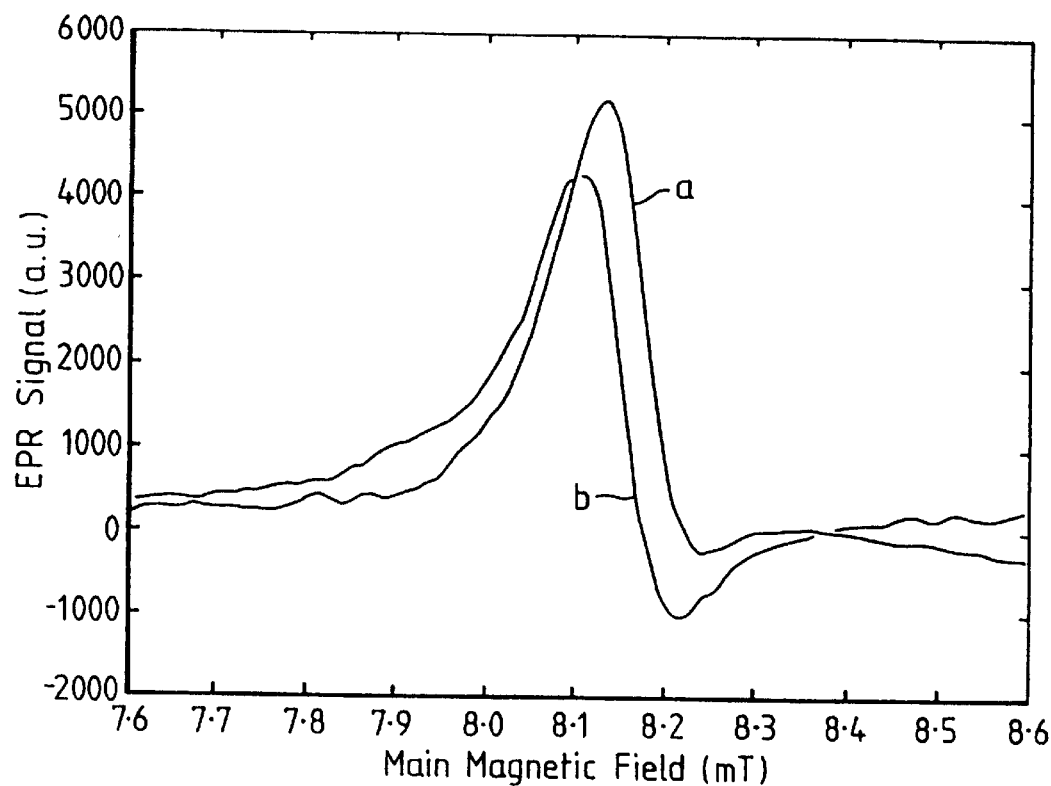
FIG. 7 is a graph of measured EPR signals against magnetic field strength showing an EPR spectrum for a free radical test sample, obtained in CW mode at 220 MHz, in which (a) is the RXS channel receiving, and (b) is the RXR channel receiving.

To show the equivalence of the EPR signal detected by the two receiving channels RXS and RXR, experiments were performed with an rf spectrometer operating in CW mode. The TX loop-gap resonator, tuned to 220 MHz, is used as transmitter. Either an RXS or an RXR channel is used as a receiver. Because no Automatic Frequency Control (AFC) was used, measured spectra are a mixture of absorption and dispersion components. A sample of DPPH ($\alpha,\alpha'$-diphenyl-$\beta$-picryl-hydrazyl) was used and, as shown in FIG. 7, the two spectra (a and b) are so close as to be practically equivalent.

Pulsed EPR Detection at 220 MHz

Figure 8:
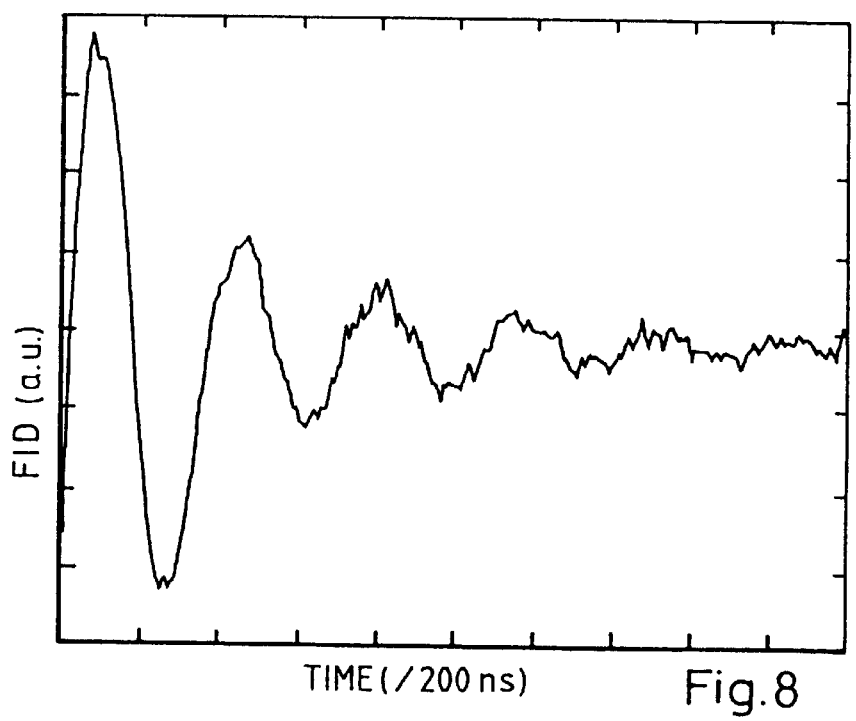
FIG. 8 is a graph of EPR pulsed detection of FID of lithium phthalocyanine ($10^4$ pulses, averaged over 30 seconds) with a TX/RX assembly tuned to 220 MHz at 8.1 mT.

Preliminary results of pulsed EPR were obtained using a TX/RX assembly tuned to 220 MHz. A sample of 1.5 g of lithium phthalocyanine (LiPtc) powder, previously de-oxygenated, and contained in a small cylinder and inserted in a sample tube containing 50 ml of physiological saline solution, was used. The measured linewidth of LiPtc is approximately 0.02 mT. FIG. 8 shows a FID signal obtained with the main magnetic field selected very close to the resonance value. Although these are preliminary results, and the pulsed EPR spectrometer has not been optimised, a good signal-to-noise ratio was observed when the resonator was loaded with a large volume saline solution.

Figure 9:
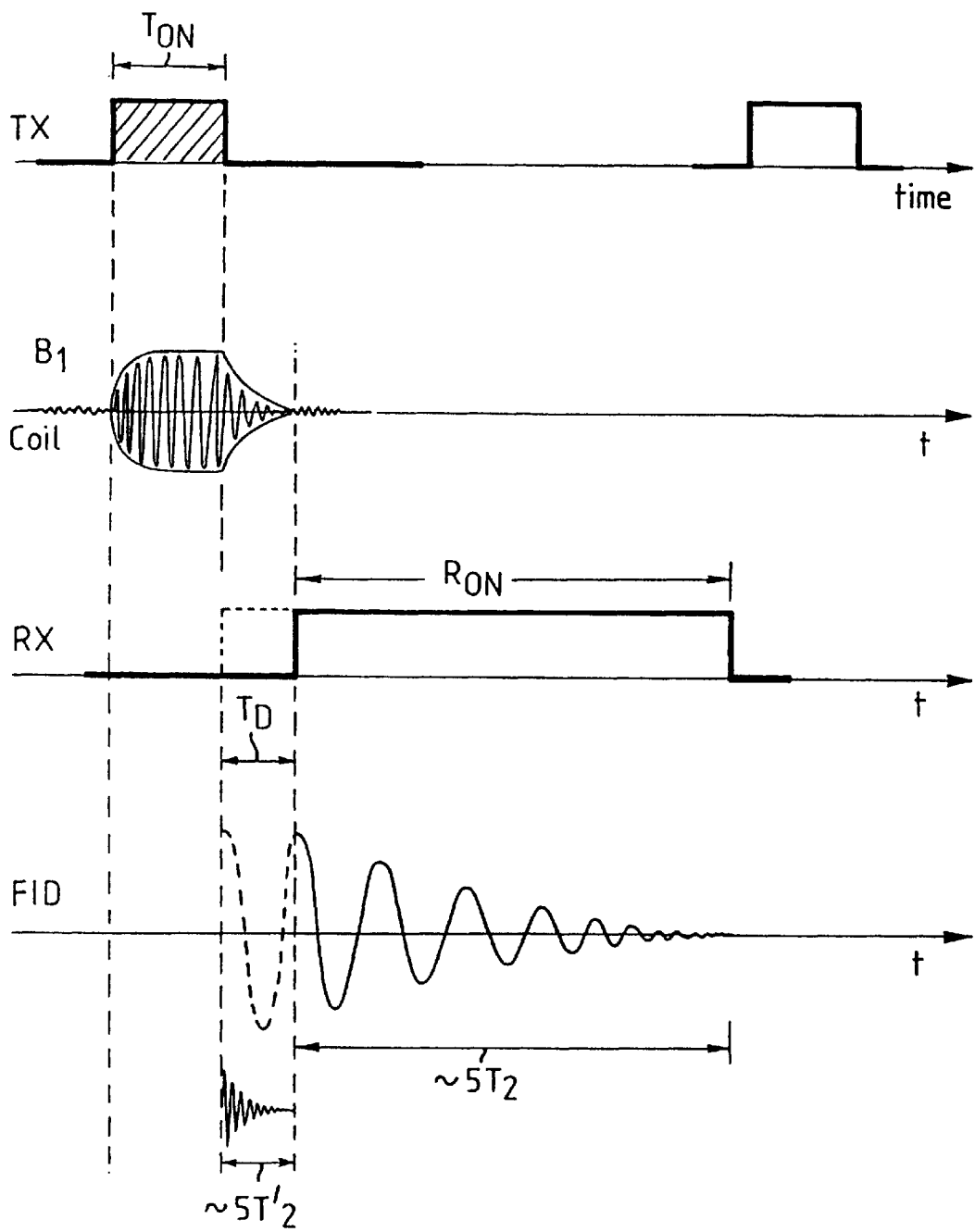
FIG. 9 is a timing diagram showing an example of a pulse sequence and diagrammatically the beneficial effect of the invention.

In the timing diagram of FIG. 9 the conventional 'ringing down' of the $B_1$ field of the transmitter is illustrated, signifying that only, FID signal with relatively long $T_2$ times can be measured. However, when the present invention is employed, FID signals with significantly shorter $T_2$ times (such as the $T_2'$ decay shown in the figure) can be detected. $T_2'$ is of such a small magnitude that, using conventional apparatus, the FID signal will have decayed substantially to zero (~5 $T_2'$) during the instrumental dead time Two orthogonal resonance modes of the birdcage resonator are employed as the two coils RXR and RXS in FIG. 3, and the birdcage resonator may be connected by inductive or capacitive means to the receiver circuitry.

In the embodiments illustrated above, the two RF receiver resonators are arranged mutually orthogonally, although this is not essential providing that they are arranged to detect fields in mutually non-parallel directions, in order that discrimination of the FID signal can be achieved by combination of the received signals. It is possible to realise the invention in duplex configuration with identical RXR and RXS coils in which the sample to be investigated is positioned within only one coil. The other coil could be elsewhere within the field magnet or could even be positioned outside the field magnet. In this case the relative orientation of the two receiving coils is not important, as only one will detect the FID.

The equalisation of the two receiver coils described above is achieved by balancing the receiver channels. It is also possible to combine the two received signals in a manner other than by way of simple subtraction in order to effect a degree of equalisation. For example, by selecting a certain linear combination of the received RF signals, the amplitudes of the respective received ringing signals may be balanced.

The above embodiment has been described by way of example only and it will be understood that variations may be made to it without departing from the scope of the invention.

What is claimed is:

1. A method of reducing dead-time during magnetic resonance investigation of an object comprising the steps of:
    applying a static magnetic field to the object;
    applying an RF excitation pulse to the object,
    detecting, after the RF excitation pulse has ceased, a first RF signal by means of a first RF receiver resonator and a second RF signal by means of a second RF receiver resonator, both of said first and second RF receiver resonators surrounding said object, and being arranged to detect respective fields in mutually non-parallel directions, said first RF signal and said second RF signal containing a ringing component,
    providing an output signal free of said ringing component by generating a difference signal representing the difference between said first RF signal and said second RF signal.

2. A method according to claim 1, wherein the first RF signal is inverted, and then combined with the second RF signal to provide said difference signal.

3. A method according to claim 1, wherein the relative phase and/or the relative amplitude between the first and second RF signals is adjusted.

4. A method according to claim 1, wherein application of said RF excitation pulse is followed by application of a phase-reversed RF pulse.

5. A method according to claim 1, wherein at least one of said first and second RF receiver resonators is used to apply said RF excitation pulse.

6. A method according to claim 1, wherein the carrier frequency of the RF excitation pulse is of the order of a few hundred MHz.

7. Apparatus for reducing dead-time in a magnetic resonance apparatus comprising:
    an RF transmitter resonator for applying an RF excitation pulse;

first and second RF receiver resonators arranged to surround a sample under investigation and located in mutually non-parallel directions, said first and second RF receiver resonators having substantially identical ringing characteristics, said first and second RF receiver resonators arranged to detect respective signals each containing a ringing component, in response to said RF excitation pulse;

a 180 degree phase shifter for introducing a 180 degree shift between the signals detected by said first and second receiver resonators;

a signal combiner for receiving said phase shifted signals and generating an output representing the difference between the detected RF signals, to provide an output free of said ringing component.

8. A method for eliminating a ringing component during a magnetic resonance investigation of an object comprising the steps of:

applying a static magnetic field to the object;

applying an RF excitation pulse to the object;

detecting, via a first and a second RF receiver resonator surrounding said object and arranged to detect fields in mutually non-parallel directions, respective RF signals comprising a directional information component and a non-directional ringing component; and combining the RF signal detected by said first RF receiver resonator with that detected by said second resonator, in such a way as to provide a signal containing said directional information component but free of said non-directional ringing component.

9. A method according to claim 1 for use in imaging.

10. Pulsed magnetic resonance apparatus comprising:

means for applying a static magnetic field;

an RF transmitter resonator for applying an RF excitation pulse to an object under investigation;

first and second RF receiver resonators surrounding said object and arranged to detect first and second RF signals each containing a respective ringing component, in response to the RF excitation pulse;

means to provide an output signal free of said ringing component, said output signal representing the difference between the signals received by said first and said second RF receiver resonators.

11. Apparatus according to claim 10, wherein said RF transmitter resonator is a loop-gap resonator.

12. Apparatus according to claim 10, wherein each of the first and second RF receiver resonators is connected to a separate receiver channel, and a signal attenuator and/or a phase shifter is provided in at least one of the receiver channels to vary the relative amplitude and/or phase between the signals received by the two receiver resonators.

13. Apparatus according to claim 10, wherein the first and the second RF receiver resonators are arranged to detect fields in mutually non-parallel directions.

14. Apparatus according to claim 13, wherein the first and the second RF receiver resonators are arranged mutually perpendicular to receive in phase quadrature with each other.

15. Apparatus according to any one of claim 10, wherein the first RF receiver resonator is arranged parallel to the main static magnetic field.

16. Apparatus according to claim 10, wherein said first and second RF receiver resonators are provided by two modes of a birdcage resonator.

17. Apparatus according to claim 10, wherein at least one of said first and second RE receiver resonators is arranged and connected also to serve as the RF transmitter coil, the apparatus including switching means to switch the at least one resonator between a transmit mode and a receive mode.

18. Apparatus according to claim 10, wherein separate resonators are used for said RF transmitter resonator and said first and second RF receiver resonators, all three resonators being mutually perpendicular.

19. Apparatus according to claim 10, including means to provide an image by the technique of nuclear magnetic resonance.

20. Apparatus according to claim 10, including means to provide an image by the technique of electron paramagnetic resonance.

21. Pulsed magnetic resonance apparatus comprising:

means for applying a static magnetic field;

a single RF transmitter resonator for applying an RF excitation pulse to an object;

first and second RF receiver resonators located in mutually non-parallel directions; and means to provide a signal representing the difference between the signals received by said first and said second RF receiver resonators in response to the RF excitation pulse, wherein each of the first and second RF receiver resonators is connected to a separate receiver channel, and a signal attenuator and/or a phase shifter is provided in at least one of the receiver channels to vary the relative amplitude and/or phase between the signals received by the two receiver resonators.

* * * * *